(12) United States Patent
Lee et al.

(10) Patent No.: US 8,803,311 B2
(45) Date of Patent: Aug. 12, 2014

(54) WIRING BOARDS AND SEMICONDUCTOR PACKAGES INCLUDING THE SAME

(71) Applicant: Samsung Electronics Co., Ltd., Suwon-si (KR)

(72) Inventors: In Lee, Hwaseong-si (KR); Kilsoo Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/836,937

(22) Filed: Mar. 15, 2013

(65) Prior Publication Data

US 2013/0299978 A1 Nov. 14, 2013

(30) Foreign Application Priority Data

May 9, 2012 (KR) .................. 10-2012-0049213

(51) Int. Cl.
 *H01L 23/12* (2006.01)
(52) U.S. Cl.
 USPC .......................................... 257/700; 257/701
(58) Field of Classification Search
 USPC .......... 257/700, 701, 698; 361/718, 720, 736, 361/748
 See application file for complete search history.

(56) References Cited

U.S. PATENT DOCUMENTS

| | | | |
|---|---|---|---|
| 6,238,777 B1 | 5/2001 | Oda et al. | |
| 7,078,629 B2 | 7/2006 | Umemoto | |
| 7,098,407 B2 | 8/2006 | Kim et al. | |
| 8,018,045 B2* | 9/2011 | En et al. | 257/700 |
| 8,288,875 B2* | 10/2012 | Shimizu et al. | 257/784 |
| 2010/0116782 A1* | 5/2010 | Chujo et al. | 216/18 |
| 2010/0140800 A1 | 6/2010 | Hagihara | |
| 2010/0147559 A1* | 6/2010 | Kim et al. | 174/250 |
| 2010/0226110 A1 | 9/2010 | Kouya | |
| 2011/0225813 A1* | 9/2011 | Leung et al. | 29/825 |

FOREIGN PATENT DOCUMENTS

| | | |
|---|---|---|
| JP | 2000-349447 A | 12/2000 |
| JP | 2002-111232 A | 4/2002 |
| JP | 2002-271040 A | 9/2002 |
| JP | 2010-87145 A | 4/2010 |
| KR | 10-2008-0108820 A | 12/2008 |

* cited by examiner

*Primary Examiner* — S. V. Clark (74) *Attorney, Agent, or Firm* — Sughrue Mion, PLLC (57) ABSTRACT

A wiring board and a semiconductor package are provided. The wiring board includes: a metal core including a first surface and a second surface opposite the first surface; a first buildup portion and a second buildup portion including an insulating layer and a pad pattern sequentially stacked, the first and second buildup portions being provided on the first surface and the second surface, respectively; a mask pattern including an opening exposing the pad pattern, the mask pattern being provided on the second buildup portion; and a barrier pattern in an area in which a region of the metal core which overlaps with the pad pattern of the second buildup portion is removed, wherein a minimum width of an outer circumference of the barrier pattern is greater than a maximum width of the pad pattern of the second buildup portion.

20 Claims, 8 Drawing Sheets

WIRING BOARDS AND SEMICONDUCTOR PACKAGES INCLUDING THE SAME

CROSS-REFERENCE TO RELATED APPLICATION

This U.S. non-provisional patent application claims priority under 35 U.S.C. §119 from Korean Patent Application No. 10-2012-0049213, filed on May 9, 2012 in the Korean Intellectual Property Office (KIPO), the entire contents of which are hereby incorporated by reference.

BACKGROUND

Apparatuses and methods consistent with exemplary embodiments relate to wiring boards and semiconductor packages including the same, and more particularly, to a wiring board that can improve reliability and a semiconductor package including the same.

In a semiconductor package having a ball grid array (BGA) type structure, since an external connection terminal is surface-arranged, many pins may be provided, a mounting area is not great, and a thermal resistance and an electrical characteristic is superior. For such a reason, to meet an increase of integration of a semiconductor device and an increase of the number of input/output pins, a use of the semiconductor package adopting the BGA type structure is increasing.

A semiconductor package of the BGA type structure is classified into a solder mask defined (SMD) type and a non-solder mask defined (NSMD) type according to a ball land structure. A semiconductor package having an SMD type ball land structure and a semiconductor package having an NSMD type ball land structure are described below.

In the SMD type ball land structure, a wiring board has an upper surface on which a semiconductor chip is mounted and a lower surface facing the upper surface on which a ball land is formed, a solder ball joins a ball land as an external connection terminal, and a solder mask formed on the lower surface of the wiring board covers a part of an edge of the ball land.

In a semiconductor package having the SMD type ball land structure, a connection area of a solder ball is wide and a binding power between a ball land and the solder ball is superior due to a locking effect. However, since a contact area between the ball land and the solder ball is small, a solder joint reliability (SJR) is not good in an electrical characteristic.

In the NSMD type ball land structure, a solder mask is formed to be spaced a predetermined distance apart from a ball land formed on the lower surface of the wiring board.

In a semiconductor package having the NSMD type ball land structure, since the ball land and a solder ball are spaced apart from each other, a contact area between the solder ball and the ball land is great and thereby a solder joint reliability (SJR) is good in an electrical characteristic. However, since a connection area of the solder ball is small, a binding power of the solder ball is low as compared with the SMD type ball land structure.

SUMMARY

According to an aspect of an exemplary embodiment, there is provided a wiring board, including: a metal core including a first surface and a second surface opposite the first surface; a first buildup portion including a first insulating layer and a first pad pattern sequentially stacked, the first buildup portion being on the first surface; a second buildup portion including a second insulating layer and a second pad pattern sequentially stacked, the second buildup portion being on the second surface; a mask pattern including an opening exposing the second pad pattern, the mask pattern being on the second buildup portion; and a barrier pattern provided in an area in which a region of the metal core which overlaps with the second pad pattern is removed, wherein a minimum width of an outer circumference of the barrier pattern is greater than a maximum width of the second pad pattern.

According to an aspect of another exemplary embodiment, there is provided a semiconductor package, including: a wiring board; and a semiconductor chip mounted on the wiring board, wherein the wiring board includes: a metal core including a first surface and a second surface opposite the first surface; a first buildup portion including a first insulating layer and a first pad pattern sequentially stacked, the first buildup portion being on the first surface; a second buildup portion including a second insulating layer and a second pad pattern sequentially stacked, the second buildup portion being on the second surface; a mask pattern including an opening exposing the second pad pattern, the mask pattern being on the second buildup portion; and a barrier pattern provided in an area in which a region of the metal core which overlaps with the second pad pattern is removed, wherein a minimum width of an outer circumference of the barrier pattern is greater than a maximum width of the second pad pattern, and wherein the semiconductor chip is mounted on the first buildup portion.

According to an aspect of another exemplary embodiment, there is provided a wiring board including: a metal core; a buildup portion including a pad pattern, the buildup portion being on a surface of the metal core; a mask pattern including an opening exposing the pad pattern, the mask pattern being on the buildup portion; and a barrier pattern in an area in which a region of the metal core which overlaps with the pad pattern is removed, wherein a minimum width of an outer circumference of the barrier pattern is greater than a maximum width of the pad pattern.

BRIEF DESCRIPTION OF THE DRAWINGS

Exemplary embodiments will be described below in more detail with reference to the accompanying drawings. Exemplary embodiments may, however, be embodied in different forms and should not be construed as limited to the exemplary embodiments set forth herein. Rather, these exemplary embodiments are provided so that this disclosure will be thorough and complete, and will fully convey the scope of the inventive concept to those skilled in the art. Like numbers refer to like elements throughout.

DETAILED DESCRIPTION OF EXEMPLARY EMBODIMENTS

Exemplary embodiments will be described more fully hereinafter with reference to the accompanying drawings. An exemplary embodiment may, however, be embodied in many different forms and should not be construed as limited to exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be further understood that the terms "comprises" and/or "comprising," or "includes" and/or "including," when used in this specification, specify the presence of stated features, regions, integers, steps, operations, elements, and/or components, but do not preclude the presence or addition of one or more other features, regions, integers, steps, operations, elements, components, and/or groups thereof. It will also be understood that when an element such as a layer, region, or substrate is referred to as being "on" or "onto" another element, it may lie directly on the other element or intervening elements or layers may also be present.

Exemplary embodiments may be described with reference to cross-sectional illustrations, which are schematic illustrations of exemplary embodiments. As such, variations from the shapes of the illustrations, as a result, for example, of manufacturing techniques and/or tolerances, are to be expected. Thus, exemplary embodiments should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of exemplary embodiments.

Figure 1:
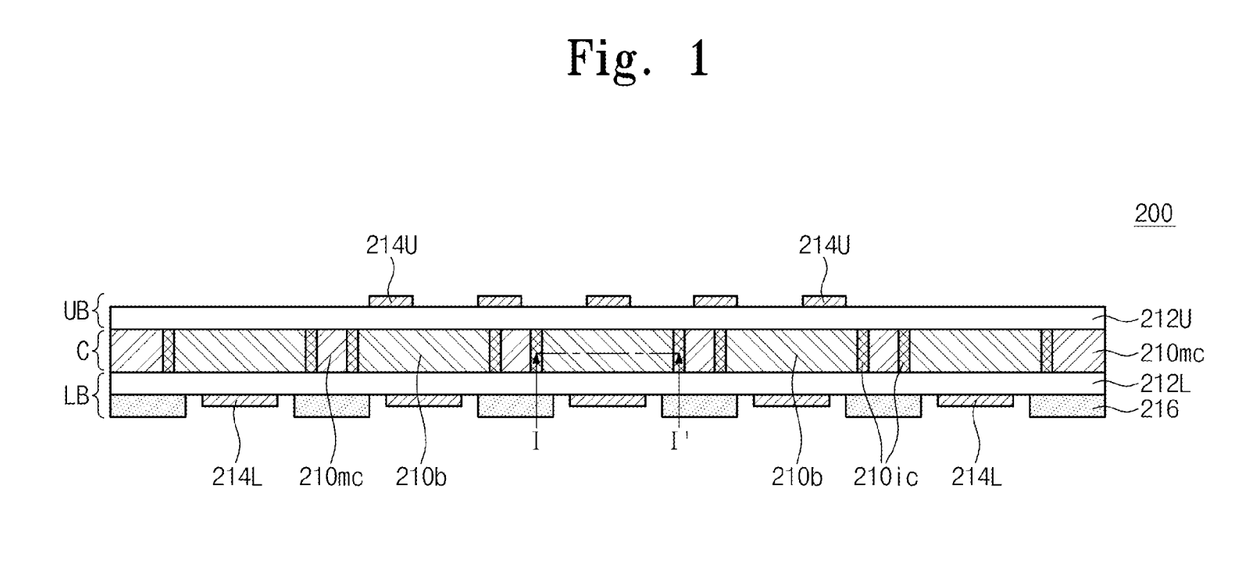
FIG. 1 is a cross sectional view for explaining a wiring board in accordance with one or more exemplary embodiments.
Figure 2:
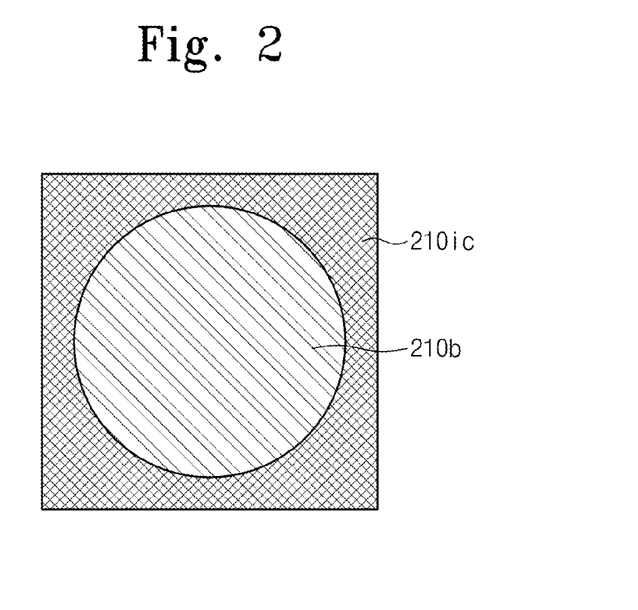
FIGS. 2 through 9 are plan cross sectional views for explaining a constitution of FIG. 1, in accordance with one or more exemplary embodiments.

FIG. 1 is a cross sectional view for explaining a wiring board 200 in accordance with one or more exemplary embodiments. FIG. 2 is a plan cross sectional view for explaining one constitution of FIG. 1.

Referring to FIGS. 1 and 2, a wiring board 200 may include a core portion C, a barrier pattern 210b inside of the core portion C, an upper buildup portion UB on an upper surface of the core portion C and a lower buildup portion LB on a lower surface of the core portion C.

The core portion C may extend in a specific direction. The core portion C may include a metal core 210mc and an insulating core 210ic. The lower and upper buildup portions LB and UB may cover lower surfaces and upper surfaces of the metal core 210mc and the insulating core 210ic, respectively. The lower and upper buildup portions LB and UB may include insulating layers 212L and 212U and pad patterns 214L and 214U sequentially stacked on the lower surfaces and the upper surfaces of the metal core 210mc and the insulating core 210ic, respectively. The insulating layers 212L and 212U may include a prepreg. The pad patterns 214L and 214U may have a circuit pattern shape. The lower buildup portion LB may further include a mask pattern 216 having an opening exposing the pad pattern 214L. The opening of the mask pattern 216 is a land area which a solder ball joins. The mask pattern 216 may include a solder resist (SR). Furthermore, the upper buildup portion UB may include a mask pattern having an opening exposing the pad pattern 214U.

In the present exemplary embodiment, the wiring board 200 has a plurality of metal cores 210mc and insulating cores 210ic as illustrated. However, it is understood that the number of metal cores 210mc and insulating cores 210ic in the wiring board 200 is not limited thereto in one or more other exemplary embodiments. That is, the wiring board 200 may include a plurality of metal cores 210mc and insulating cores 210ic spaced apart from one another on a plane or may include one metal core 210mc and one insulating core 210ic, a part of which is removed, on a plane.

The metal core 210mc may be provided to a center or a central area of the wiring board 200 in a direction perpendicular to an extending direction of the core portion C. The metal core 210mc may include at least one selected from copper (Cu), stainless steel, aluminum (Al), nickel (Ni), magnesium (Mg), zinc (Zn), tantalum (Ta), and combinations thereof. For example, the metal core 210mc may include copper.

The insulating core 210ic may be provided to a center or a central area of the wiring board 200 in a direction perpendicular to an extending direction of the core portion C. A side of the insulating core 210ic may be disposed to contact a side of the metal core 210mc. The insulating core 210ic may include the same material, or a similar material, as a material of the insulating layers 212L and 212U. For instance, the insulating core 210ic may include a prepreg.

The pad patterns 214L and 214U may have a circle shape plan cross section. Furthermore, since the pad patterns 214L and 214U have a circuit pattern shape, the pad patterns 214L and 214U may be electrically connected to the metal cores 210mc. The pad patterns 214L and 214U may further include a connection wiring pattern to be electrically connected to the metal core 210mc.

The barrier pattern 210b may be in an area between the metal cores 210mc. The barrier pattern 210b may be in an area in which the metal core 210mc of the core portion C which overlaps the pad pattern 214L of the lower buildup portion LB is removed. That is, the barrier pattern 210b may be in an area between the metal cores 210mc while interposing the insulating core 210ic. The barrier pattern 210b may include copper. A minimum width of an outer circumference of the barrier pattern 210b may be greater than a maximum width of the pad pattern 214L of the lower buildup portion LB.

As illustrated, if the pad patterns 214L and 214U have a circle shape plan cross section, the barrier pattern 210b may have a plan cross section of the same shape as the pad patterns 214L and 214U. At this time, the maximum width of the outer circumference of the barrier pattern 210b may be greater than the maximum width of the opening of the mask pattern 216.

That is, the width of the outer circumference of the barrier pattern 210b may be greater than the maximum width of the pad pattern 214L and may be greater than the opening of the mask pattern 216. A crack generated from the pad patterns 214L and 214U and/or the opening of the mask pattern 216 exposing the pad patterns 214L and 214U may be prevented from reaching an inside of the wiring board 200. Thus, the wiring board 200 having improved reliability may be provided.

With reference to FIGS. 3 through 9, a constitution of a wiring board 200 in accordance with one or more other exemplary embodiments. FIGS. 3 through 9 are plan cross sectional views of a barrier pattern 210b of a wiring board 200 in accordance with one or more other exemplary embodiments. For convenience of description, FIGS. 3 through 9 will be described mainly with reference to the barrier pattern 210b.

FIGS. 3 through 6 are plan cross sectional views for explaining a barrier pattern 210b of a wiring board 200 in accordance with one or more other exemplary embodiments.

Figure 3:
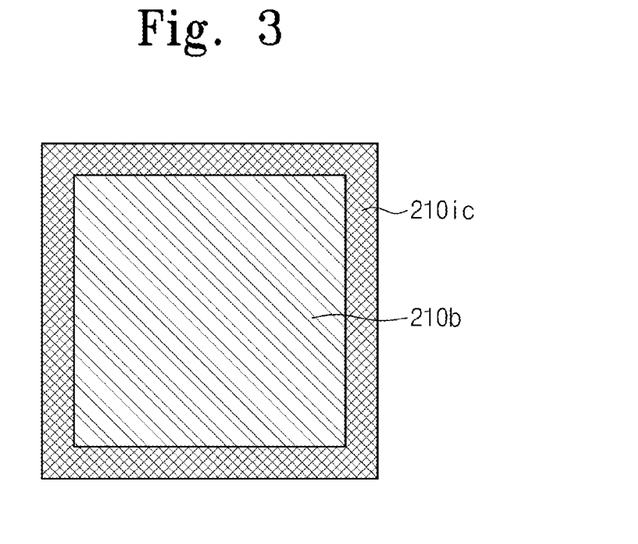
Figure 4:
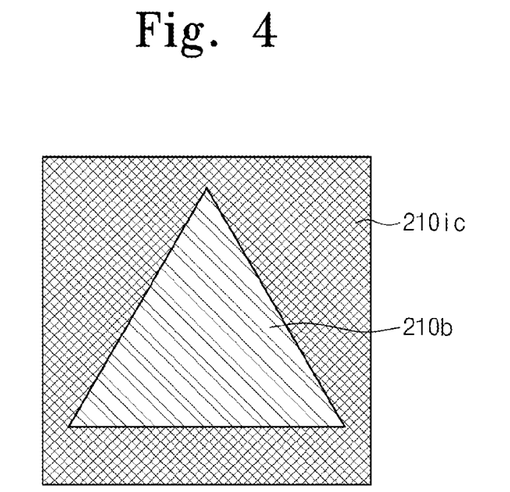
Figure 5:
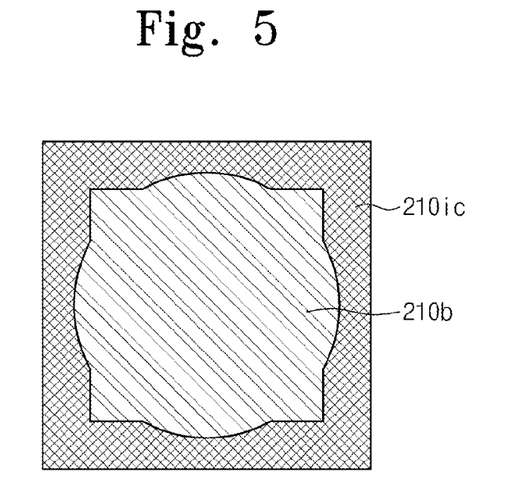
Figure 6:
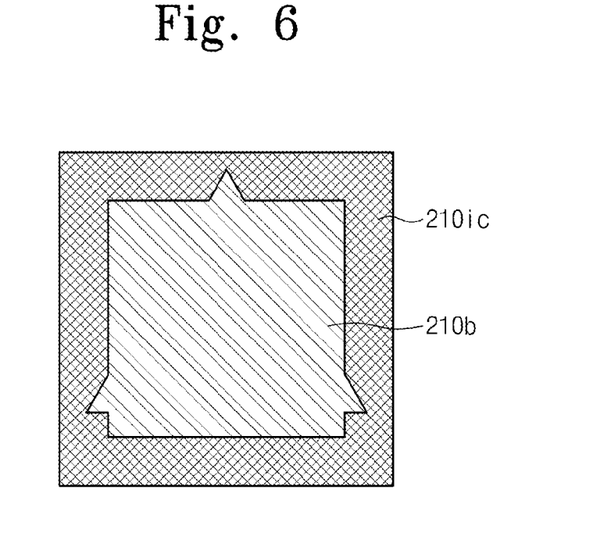

Referring to FIGS. 3 through 6, each of the barrier patterns 210b has a shape different from a circle shape. FIG. 3 shows the barrier pattern 201b having an outer circumference of a square shape, FIG. 4 shows the barrier pattern 210b having an outer circumference of a triangular shape, FIG. 5 shows the barrier pattern 210b having an outer circumference of a shape corresponding to a combination of a square shape and a circle shape, and FIG. 6 shows the barrier pattern 210b having an outer circumference of a shape corresponding to a combination of a square shape and a triangular shape. However, it is understood that one or more other exemplary embodiments are not limited thereto. The barrier pattern 210b of each of the wiring boards 200 in accordance with various exemplary embodiments may have an outer circumference of various shapes of polygons.

Figure 7:
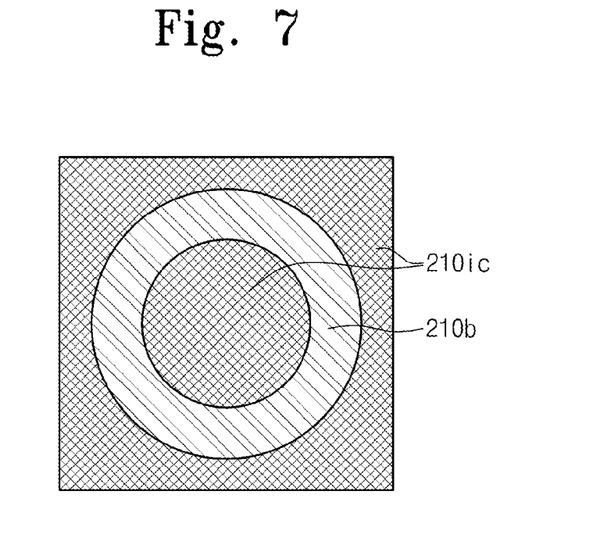
Figure 8:
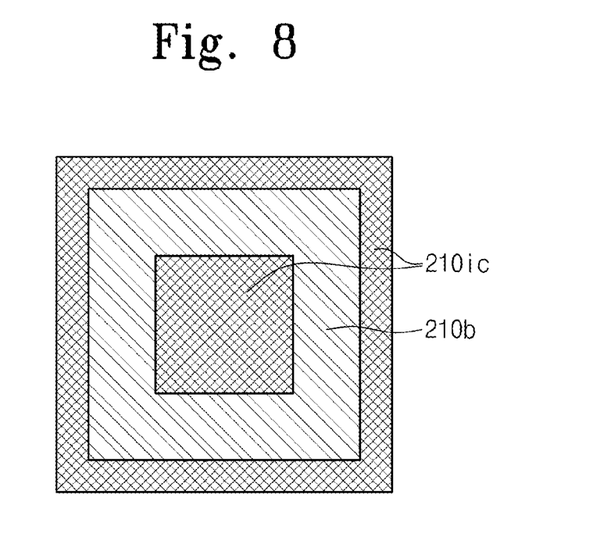
Figure 9:
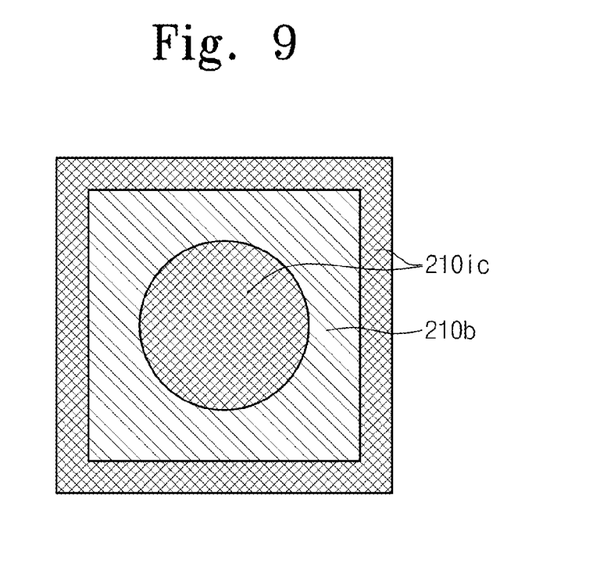

FIGS. 7 through 9 are plan cross sectional views for explaining a barrier pattern 210b of each of wiring boards 200 in accordance with one or more other exemplary embodiments.

Referring to FIGS. 7 through 9, the barrier patterns 210b have different structures from the barrier patterns 210b of FIGS. 2 through 6. A barrier pattern 210b of each of the wiring boards 200 in accordance with one or more other exemplary embodiments may further include an inner circumference. A shape of an inner circumference of the barrier pattern 210b may be a circle or a polygon. A maximum width of the inner circumference of the barrier pattern 210b may be smaller than a minimum width of a pad pattern 214L of a lower buildup portion LB of the wiring board 200.

FIG. 7 shows the barrier pattern 210b having a circle shape outer circumference and a circle shape inner circumference, FIG. 8 shows the barrier pattern 210b having a square shape outer circumference and a square shape inner circumference, and FIG. 9 shows the barrier pattern 210b having a square shape outer circumference and a circle shape inner circumference. However, it is understood that one or more other exemplary embodiments are not limited thereto. A barrier pattern 210b of each of wiring boards 200 in accordance with one or more other exemplary embodiments may have various shapes of the outer circumferences and the inner circumferences.

In the wiring board 200 in accordance with one or more exemplary embodiments, by providing a barrier pattern 210b to an area in which a region of a metal core 210mc which overlaps a pad pattern 214L and 214U is removed, a crack generated from the pad patterns 214L and 214U and/or an opening of a mask pattern 216 exposing the pad patterns 214L and 214U may be prevented from reaching an inside of a wiring board 200. Thus, the wiring board 200 having improved reliability may be provided.

Figure 10:
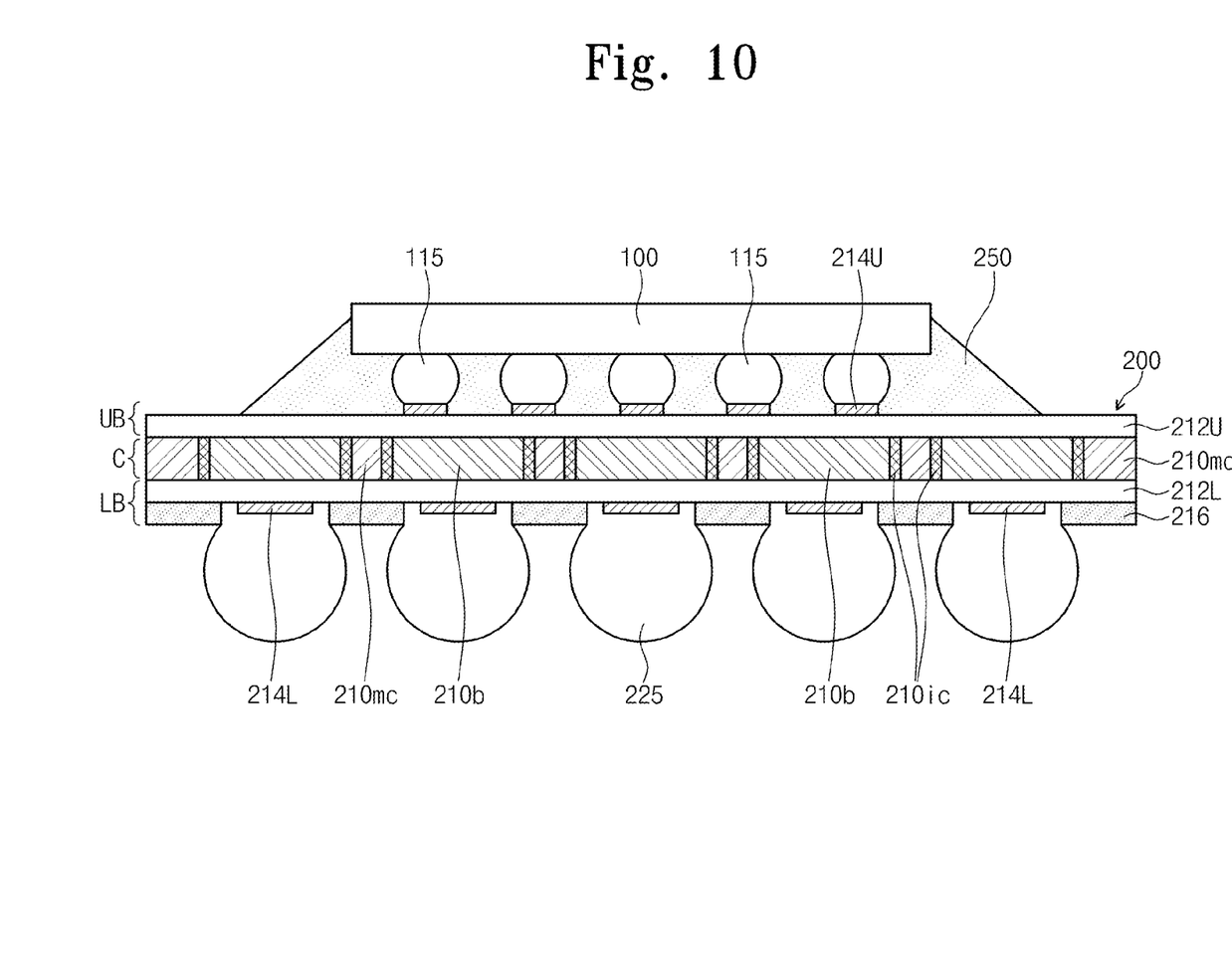
FIG. 10 is a cross sectional view for explaining a semiconductor package in accordance with one or more exemplary embodiments.

FIG. 10 is a cross sectional view for explaining a semiconductor package in accordance with one or more exemplary embodiments.

Referring to FIG. 10, a semiconductor package may include a semiconductor chip 100 and a wiring board 200. The semiconductor chip 100 may be mounted on the wiring board 200. The semiconductor chip 100 may be electrically connected to the wiring board 200 by a connection solder ball 115.

A bonding pad may be provided on an active surface of the semiconductor chip 100. The bonding pad may be electrically connected to the connection solder ball 115.

The connection solder ball 115 can electrically connect the semiconductor chip 100 and the wiring board 200. According to one or more exemplary embodiments, each of the connection solder balls 115 may be a solder bump. By using the solder bump as the connection solder ball 115, a size of the semiconductor package may be reduced.

According to one or more other exemplary embodiments, the semiconductor chip 100 is mounted on a package board and may be indirectly mounted on the wiring board 200 by the connection solder ball 115 provided to the package board.

A pad pattern 214U of an upper buildup portion UB of the wiring board 200 is electrically connected to the connection solder ball 115 and thereby the wiring board 200 and the semiconductor chip 100 can be electrically connected to each other. A pad pattern 214L of a lower buildup portion LB of the wiring board 200 is electrically connected to a solder ball 225 for the wiring board 200. The solder ball 225 for the wiring board 200 can electrically connect the semiconductor chip 100 and an external device.

Since the pad patterns 214L and 214U have a circuit pattern form, they can be electrically connected to a metal core 210mc.

Since the pad patterns 214L and 214U of the lower and upper buildup portions LB and UB have a circuit pattern form, the pad pattern 214U of the upper buildup portion UB can be electrically connected to the semiconductor chip 100 and the metal core 210mc and the pad pattern 214L of the lower buildup portion LB can be electrically connected to the solder ball 225 for wiring board and the metal core 210mc.

The semiconductor package may include a molding part 250 molding a space between the semiconductor chip 100 and the upper buildup portion UB of the wiring board 200. Although the molding part 250 is illustrated as having an underfill shape, the molding part 250 may cover an entire surface of the upper buildup portion UB of the wiring board 200 and the semiconductor chip 100.

In the semiconductor package in accordance with one or more exemplary embodiments, by providing a barrier pattern 210b to an area in which a region of a metal core 210mc which overlaps a pad pattern 214L of a wiring board 200 is removed, a crack generated from the pad patterns 214L and 214U and/or an opening of a mask pattern 216 exposing the pad patterns 214L and 214U may be prevented from reaching an inside of the wiring board 200. Thus, the semiconductor package having improved reliability may be provided.

Figure 11:
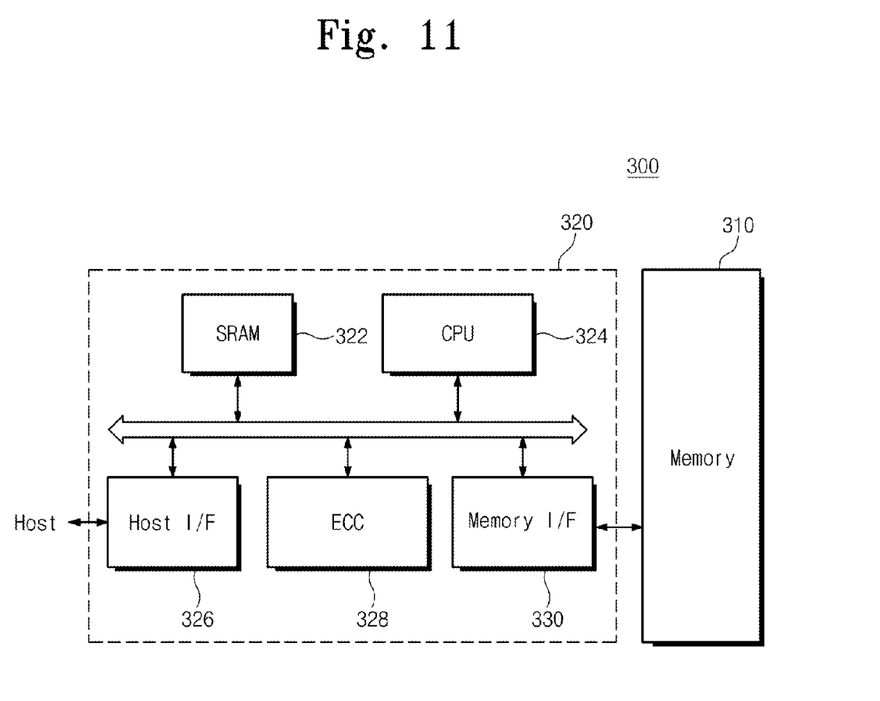
FIG. 11 is a block diagram for explaining a memory card including a semiconductor package in accordance with one or more exemplary embodiments.

FIG. 11 is a block diagram for explaining a memory card 300 including a semiconductor package in accordance with an exemplary embodiment.

Referring to FIG. 11, a semiconductor package in accordance with an exemplary embodiment may be applied to a memory card 300. The memory card 300 may include a memory controller 320 controlling all data exchanges between a host and a memory 310. A static random-access memory (SRAM) 322 may be used as an operating memory of central processing unit (CPU) 324. A host interface 326 may include a data exchange protocol of the host connected to the memory card 300. An error correction code (ECC) 328 can detect and correct an error included in data read from the memory 310. A memory interface 330 is connected to the memory 310. The CPU 324 performs an overall control operation for data exchange of the memory controller 320.

The memory 310 applied to the memory card 300 includes a semiconductor package in accordance with one or more exemplary embodiments and thereby a semiconductor memory device having improved reliability can be realized.

Figure 12:
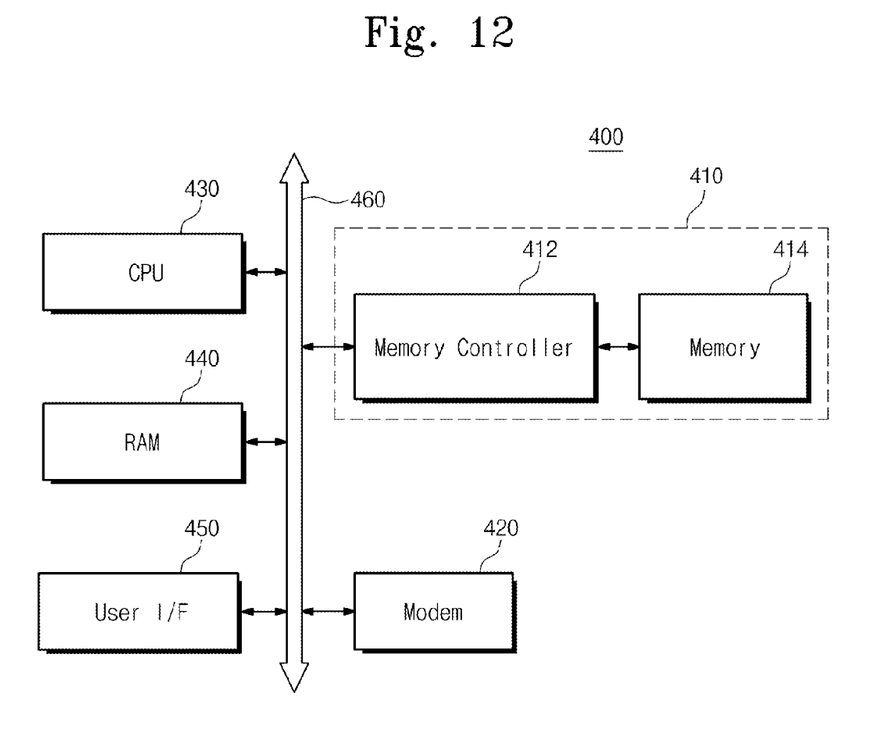
FIG. 12 is a block diagram for explaining an information processing system to which a semiconductor package in accordance with one or more exemplary embodiments is applied.

FIG. 12 is a block diagram for explaining an information processing system 400 to which a semiconductor package in accordance with an exemplary embodiment is applied.

Referring to FIG. 12, an information processing system 400 may include a memory system 410 including a semiconductor package including a memory in accordance with one or more exemplary embodiments. The information processing system 400 may include a mobile device or a computer. The information processing system 400 may include the memory system 410, a modem 420, a central processing unit (CPU) 430, a random access memory (RAM) 440, and a user interface 450 electrically connected to a system bus 460. The memory system 410 may store data processed by the CPU 430 or data input from the outside. The memory system 410 may include a memory controller 412 and a memory 414 and may be constituted to be the same as or similar to the memory card 300 described with reference to FIG. 11. The information processing system 400 may be provided with a memory card, a solid state disk (SSD), a camera image processor, and an application chipset. The memory system 410 may include a solid state disk (SSD) and, in this case, the information processing system 400 can stably and reliably store large amounts of data in the memory system 410.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. The present inventive concept is defined by the following claims, with equivalents of the claims to be included therein.

What is claimed is:

1. A wiring board comprising:
a metal core comprising a first surface and a second surface opposite the first surface;
a first buildup portion comprising a first insulating layer and a first pad pattern sequentially stacked, the first buildup portion being on the first surface;
a second buildup portion comprising a second insulating layer and a second pad pattern sequentially stacked, the second buildup portion being on the second surface;
a mask pattern comprising an opening exposing the second pad pattern, the mask pattern being on the second buildup portion; and
a barrier pattern in an area in which a region of the metal core which overlaps with the second pad pattern is removed,
wherein a minimum width of an outer circumference of the barrier pattern is greater than a maximum width of the second pad pattern.

2. The wiring board of claim 1, wherein a shape of the outer circumference of the barrier pattern is a circle or a polygon.

3. The wiring board of claim 1, wherein the barrier pattern comprises copper.

4. The wiring board of claim 1, wherein a maximum width of the outer circumference of the barrier pattern is greater than a maximum width of the opening of the mask pattern.

5. The wiring board of claim 1, wherein a maximum width of an inner circumference of the barrier pattern is less than a minimum width of the second pad pattern.

6. The wiring board of claim 5, wherein a shape of the inner circumference of the barrier pattern is a circle or a polygon.

7. The wiring board of claim 1, wherein the mask pattern comprises a solder resist.

8. The wiring board of claim 1, wherein at least one of the first insulating layer and the second insulating layer comprises a prepreg.

9. A semiconductor package comprising:
a wiring board; and
a semiconductor chip mounted on the wiring board,
wherein the wiring board comprises:
a metal core comprising a first surface and a second surface opposite the first surface;
a first buildup portion comprising a first insulating layer and a first pad pattern sequentially stacked, the first buildup portion being on the first surface;
a second buildup portion comprising a second insulating layer and a second pad pattern sequentially stacked, the second buildup portion being on the second surface;
a mask pattern comprising an opening exposing the second pad pattern, the mask pattern being on the second buildup portion; and
a barrier pattern in an area in which a region of the metal core which overlaps with the second pad pattern is removed,
wherein a minimum width of an outer circumference of the barrier pattern is greater than a maximum width of the second pad pattern, and
wherein the semiconductor chip is mounted on the first buildup portion.

10. The semiconductor package of claim 9, wherein a shape of the outer circumference of the barrier pattern is a circle or a polygon.

11. The semiconductor package of claim 9, wherein a maximum width of the outer circumference of the barrier pattern is greater than a maximum width of the opening of the mask pattern.

12. The semiconductor package of claim 9, wherein a maximum width of an inner circumference of the barrier pattern is less than a minimum width of the second pad pattern.

13. The semiconductor package of claim 9, further comprising a solder ball on the second pad pattern.

14. The semiconductor package of claim 9, further comprising a connection solder ball which electrically connects the semiconductor chip and the first pad pattern.

15. The semiconductor package of claim 9, further comprising a molding part which molds a space between the semiconductor chip and the first buildup portion of the wiring board.

16. A memory device comprising:
a memory comprising the semiconductor package of claim 9; and
a memory controller which controls a data exchange between the memory and a host device.

17. A wiring board comprising:
a metal core;
a buildup portion comprising a pad pattern, the buildup portion being on a surface of the metal core;
a mask pattern comprising an opening exposing the pad pattern, the mask pattern being on the buildup portion; and
a barrier pattern in an area in which a region of the metal core which overlaps with the pad pattern is removed,
wherein a minimum width of an outer circumference of the barrier pattern is greater than a maximum width of the pad pattern.

18. The wiring board of claim 17, wherein:
the buildup portion further comprises an insulating layer; and
the insulating layer and the pad pattern are sequentially stacked.

19. The wiring board of claim 17, wherein a maximum width of the outer circumference of the barrier pattern is greater than a maximum width of the opening of the mask pattern.

20. The wiring board of claim 17, wherein a maximum width of an inner circumference of the barrier pattern is less than a minimum width of the pad pattern.

* * * * *